(12) United States Patent
Hwang et al.

(10) Patent No.: US 11,283,049 B2
(45) Date of Patent: Mar. 22, 2022

(54) BARRIER FILM AND AN ELECTRONIC DEVICE COMPRISING THE SAME

(75) Inventors: Jang Yeon Hwang, Seoul (KR); Dong Ryul Kim, Daejeon (KR); Seoung Lac Ma, Cheongju-si (KR)

(73) Assignee: LG CHEM, LTD., Seoul (KR)

( * ) Notice: Subject to any disclaimer, the term of this patent is extended or adjusted under 35 U.S.C. 154(b) by 305 days.

(21) Appl. No.: 13/513,474

(22) PCT Filed: Dec. 3, 2010

(86) PCT No.: PCT/KR2010/008653
§ 371 (c)(1),
(2), (4) Date: Sep. 28, 2012

(87) PCT Pub. No.: WO2011/068388
PCT Pub. Date: Jun. 9, 2011

(65) Prior Publication Data
US 2013/0011646 A1 Jan. 10, 2013

(30) Foreign Application Priority Data
Dec. 3, 2009 (KR) .......................... 10-2009-0119092

(51) Int. Cl.
*H01L 51/52* (2006.01)
*B32B 7/02* (2019.01)
(Continued)

(52) U.S. Cl.
CPC ............ *H01L 51/5256* (2013.01); *B32B 7/02* (2013.01); *B32B 9/04* (2013.01); *B32B 27/14* (2013.01);
(Continued)

(58) Field of Classification Search
CPC .......... H01L 51/5256; B32B 7/02; B32B 9/04
(Continued)

(56) References Cited

U.S. PATENT DOCUMENTS

| 6,855,396 B1* | 2/2005 | Mennig | B05D 7/546 |
| | | | 427/314 |
| 2002/0125822 A1* | 9/2002 | Graff | H01L 51/5256 |
| | | | 313/506 |

(Continued)

FOREIGN PATENT DOCUMENTS

| CN | 100482849 C | 4/2009 |
| EP | 1557479 A1 | 7/2005 |

(Continued)

OTHER PUBLICATIONS

"Classification of Simple Oxides: A Polarizability Approach", Vesselin Dimitrov and Takayuki Komatsu, Journal of Solid State Chemistry: 163, 100-112 (2002).

(Continued)

*Primary Examiner* — Tong Guo
(74) *Attorney, Agent, or Firm* — Dentons US LLP

(57) ABSTRACT

A barrier film including a first layer formed of a semicovalent inorganic material and a second layer formed of an ionic inorganic material is provided. Here, the first layer and the second layer are alternately disposed. The barrier film having an improved moisture barrier property compared to a gas-barrier plastic composite film of the prior art manufactured using only a metal oxide or nitride may be provided.

11 Claims, 3 Drawing Sheets

(a)

(b)

(c)

(d)

(51) Int. Cl.
  *B32B 27/28* (2006.01)
  *B32B 27/38* (2006.01)
  *B32B 27/36* (2006.01)
  *B32B 27/14* (2006.01)
  *B32B 9/04* (2006.01)

(52) U.S. Cl.
  CPC .......... *B32B 27/281* (2013.01); *B32B 27/286* (2013.01); *B32B 27/36* (2013.01); *B32B 27/365* (2013.01); *B32B 27/38* (2013.01); *B32B 2311/20* (2013.01); *B32B 2311/22* (2013.01); *B32B 2457/00* (2013.01); *Y10T 428/265* (2015.01); *Y10T 428/31507* (2015.04); *Y10T 428/31511* (2015.04); *Y10T 428/31533* (2015.04); *Y10T 428/31551* (2015.04); *Y10T 428/31721* (2015.04); *Y10T 428/31786* (2015.04); *Y10T 428/31935* (2015.04)

(58) Field of Classification Search
  USPC ....... 428/220, 688, 702, 698, 446, 336, 412, 428/480, 413, 419, 473.5, 522, 42, 3.1, 428/690, 1.33, 1.3, 1.1, 4, 23.1, 52, 2, 428/423.1
  See application file for complete search history.

(56) References Cited

U.S. PATENT DOCUMENTS

| | | | |
|---|---|---|---|
| 2004/0131793 A1* | 7/2004 | Bier | B05D 7/546 427/535 |
| 2004/0131867 A1* | 7/2004 | Bier | B05D 7/546 428/447 |
| 2005/0017633 A1* | 1/2005 | Miyadera | 313/512 |
| 2006/0062937 A1* | 3/2006 | Padiyath et al. | 428/1.33 |
| 2009/0079328 A1 | 3/2009 | Fedorovskaya et al. | |
| 2010/0015431 A1* | 1/2010 | Matsui | B29C 66/82661 428/323 |
| 2010/0136308 A1* | 6/2010 | Hwang et al. | 428/213 |
| 2012/0193768 A1* | 8/2012 | Hwang et al. | 257/637 |

FOREIGN PATENT DOCUMENTS

| | | |
|---|---|---|
| JP | 08-062590 A | 3/1996 |
| JP | 08-068990 A | 3/1996 |
| JP | 1996-062590 A | 3/1996 |
| JP | 2004-050821 A | 2/2004 |
| JP | 2005-017544 A | 1/2005 |
| JP | 2005-035128 A | 2/2005 |
| JP | 2005-103768 A | 4/2005 |
| JP | 2005-329680 A | 12/2005 |
| JP | 2006-001156 A | 1/2006 |
| JP | 2006001156 | 5/2006 |
| JP | 2007-113109 A | 5/2007 |
| JP | 2007-280901 A | 10/2007 |
| JP | 2008-181838 A | 8/2008 |
| JP | 2008-207401 A | 9/2008 |
| JP | 2009-202538 A | 9/2009 |
| JP | 2009262444 A | 11/2009 |
| KR | 10-2006-0041696 A | 5/2006 |
| KR | 10-2008-0012554 A | 2/2008 |
| KR | 10-2009-0074997 A | 7/2009 |
| WO | WO2008059925 * | 5/2008 |

OTHER PUBLICATIONS

"Al2O3/ZrO2 Nanolaminates as Ultrahigh Gas-Diffusion Barriers—A Strategy for Reliable Encapsulation of Organic Electronics", Jens Meyers et al., Advanced Materials: pp. 2-9, vol. 21. No. 18, May 11, 2009.

* cited by examiner

BARRIER FILM AND AN ELECTRONIC DEVICE COMPRISING THE SAME

This application is a National Stage Entry of International Application No. PCT/KR2010/008653, filed Dec. 3, 2010, and claims the benefit of Korean Application No. 10-2009-0119092, filed on Dec. 3, 2009, which is hereby incorporated by reference in its entirety for all purposes as if fully set forth herein.

BACKGROUND

1. Field of the Invention

The present invention relates to a barrier film having an excellent gas barrier property, moisture barrier property and light transmissivity, and an electronic device including the same.

2. Discussion of Related Art

Display devices using a liquid crystal element, an electronic ink element, an organic light-emitting diode (OLED), or etc are now widely being used or are being introduced to the market. Solar light devices using an organic or inorganic material are also being used to generate clean energy. Electronic elements and metal wires, which constitute these devices, are easily deteriorated or oxidized since they are vulnerable to chemical substances (for example, moisture, oxygen, etc.) that are widely present in living environments. Therefore, it is very important to block these chemical substances from reaching the electronic elements that exist inside the devices.

According to the prior art, a glass plate is used as a substrate material or a cover plate to protect the internal electric elements which are vulnerable to chemical substances. Such a glass plate has desirable properties such as light transmissivity, thermal expansion coefficient, chemical resistance, etc. However, since the glass plate is heavy, fragile and hard, it is difficult to handle and serves as a limiting factor in product design.

In order to solve such problems as the ones mentioned above, there have been active attempts to substitute the glass plate, which has been used as a substrate material for electronic elements, with a representative plastic material that is light in weight and has excellent impact resistance and flexible characteristics. However, the commercially produced plastic films have various disadvantages compared to the glass plates so far, and thus it is necessary to make up for the shortcoming in the physical properties. In particular, the plastic films have an urgent need for improving the gas barrier property when compared to the characteristics of the glass plates.

In order to improve the gas barrier property, a gas barrier film is being manufactured by depositing an inorganic material, which is a metal oxide or nitride that includes $SiO_x$, $AlO_y$, $SiO_aN_b$, $AlO_cN_d$, etc., and has excellent gas barrier property, on at least one surface of a flexible plastic film. However, the layers of the inorganic material made by depositing have the tendency to be vulnerable to moisture, and thus gas permeability increases according to moisture (Surf. Coat. Tech., 74/75 (1995) 676; Surf. Coat. Tech., 142/144 (2001) 163).

Also, a disadvantage of the gas barrier film is that the moisture permeability continuously increases with time. This is the result of a typical layer of inorganic material deteriorating under the influence of moisture. Therefore, it is necessary to prevent the deterioration of the inorganic material layer from moisture by stacking a protective layer being water resistant or water repellent on the inorganic material layer.

Meanwhile, it is known that metal aluminum has a better moisture-barrier property than aluminum oxide (Thin Solid Films, 355/356 (1999) 500), and that, the methods of depositing a oxide and an metal thereof, that is, between an oxide deposition method and a metal deposition method, the metal deposition method provides a deposited layer having a better moisture barrier property (J. Electrochem. Soc., 149 (2002) B487). By utilizing these facts, a structure in which a metal (for example, Ag) and an oxide thereof are continuously stacked is disclosed in Korean Patent No. 10-0575563. However, although the metal film has an excellent moisture barrier property, it has a problem in that its light transmissivity is considerably reduced (J. Appl. Phys., 47 (1976) 4968). Therefore, the patent document proposes a method of additionally stacking an anti-reflection film so as to maintain light transmissivity. In this case, to achieve the excellent light transmissivity, it is necessary to precisely control the refractive index and the thickness of the additionally stacked anti-reflection film.

SUMMARY OF THE INVENTION

The present invention is directed to providing a barrier film having an excellent gas barrier property, moisture barrier property and light transmissivity, and an electronic device including the same.

One aspect of the present invention provides a barrier film having a first layer including a semicovalent inorganic material and a second layer including an ionic inorganic material. Here, the first layer and the second layer are alternately disposed.

Another aspect of the present invention provides an electronic device including the barrier film.

THE EFFECTS OF THE INVENTION

The barrier film of the present invention has an excellent gas barrier property, moisture barrier property and light transmissivity, and it is used in a variety of ways as a material in electronic devices.

BRIEF DESCRIPTION OF THE DRAWINGS

The above and other objects, features and advantages of the present invention will become more apparent to those of ordinary skill in the art by describing in detail the exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of the exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, components and/or groups thereof, but do not preclude the presence or addition of one or more other features, integers, steps, operations, elements, components and/or groups thereof.

With reference to the appended drawings, the exemplary embodiments of the present invention will be described in detail below. To aid in understanding the present invention, like numbers refer to like elements throughout the description of the figures, and the description of the same elements will not be reiterated.

The barrier film according to the present invention is characterized in that it includes a first layer formed of a semicovalent inorganic material and a second layer formed of an ionic inorganic material disposed alternately in repetition.

When the barrier film is formed so that the second layers are disposed above or below the first layer, or between the first layers, the gas barrier property, the moisture barrier property and the light transmissivity may be improved. The inorganic material used in the second layer may enhance the gas barrier property due to high interaction with a main hazardous material such as moisture, and the inorganic material used in the first layer may improve the barrier effect to moisture due to semicovalency.

Also, the barrier film may have a moisture permeability of 0.013 g/m$^2$·day or less, and more particularly it may have a moisture permeability of 0.005 g/m$^2$·day or less. The barrier film provided in the present invention has an improved moisture barrier property compared to using only an oxide or nitride of a metal used to obtain a conventional gas barrier property.

The barrier film includes one or more first layers and one or more second layers. In this case, the second layers may be disposed above or below the first layer, or may be disposed both above and below the first layer.

When there are two or more first layers in the barrier film, the second layer may be disposed between the first layers.

In addition, the barrier film according to one exemplary embodiment of the present invention includes 1) a barrier film in which the first layer and the second layer are alternately disposed, 2) a barrier film in which the second layer is disposed on the uppermost layer or lowermost layer of the barrier film, etc., but the present invention is not limited thereto.

The semicovalent inorganic material included in the first layer may include a metal oxide, a nitride of the corresponding metal and a mixture thereof, all of which have a binding energy (O1s) in the range of 530.5 eV to 533.5 eV, as measured using X-ray photoelectron spectroscopy. Also, the ionic inorganic material included in the second layer may include a metal oxide, a nitride of the corresponding metal and a mixture thereof, all of which have a binding energy (O1s) in the range of 529.6 eV to 530.4 eV, as measured using X-ray photoelectron spectroscopy. More specifically, the semicovalent inorganic material may be formed of at least one material selected from a metal oxide, a nitride of the corresponding metal and a mixture thereof, all of which have a binding energy (O1s) of 530.5 eV to 533.5 eV, and the ionic inorganic material may be formed of at least one material selected from a metal oxide, a nitride of the corresponding metal and a mixture thereof, all of which have a binding energy (O1s) of 529.6 eV to 530.4 eV, as measured using X-ray photoelectron spectroscopy.

The difference in binding energy (O1s) between the semicovalent inorganic material and the ionic inorganic material may be in the range of 0.1 eV to 3.9 eV, particularly in the range of 0.5 eV to 3.5 eV, and more particularly in the range of 1.0 eV to 3.0 eV. By using the first layer formed of the semicovalent inorganic material together with the second layer formed of the ionic inorganic material to form a barrier film, the gas- and moisture-barrier effects of the barrier film may be enhanced at the same time.

The semicovalent inorganic material according to the present invention may include an oxide, a nitride or a nitric oxide of at least one metal selected from the group consisting of silicon (Si), aluminum (Al), magnesium (Mg) and gallium (Ga), but the present invention is not limited thereto.

Also, the ionic inorganic material according to the present invention may include an oxide, a nitride or a nitric oxide of at least one metal selected from the group consisting of calcium (Ca), nickel (Ni), zinc (Zn), zirconium (Zr), indium (In), tin (Sn), titanium (Ti) and cerium (Ce), and preferably, an oxide of the metal, but the present invention is not limited thereto.

The barrier film provided in the present invention has an improved gas barrier property compared to a case in which the oxide or nitride of the metal used to achieve the conventional gas barrier property is used alone.

The physical and chemical properties of the barrier film may be varied according to the characteristics of the oxides, such as ion polarizability, cation polarizability, optical basicity or interaction parameters. Based on the variety of characteristics described above, the oxides have been classified according to a variety of classification methods. Finally, it has been known that the characteristics of the oxides are closely associated with the binding energy (T. L. Barr, "Modern ESCA, The Principles and Practice of X-Ray Photoelectron Spectroscopy", CRC Press, Boca Raton, Fla., 1994; V. Dimitrov & T. Komatsu, J. Solid State Chem. 163 (2002) 100). Meanwhile, it is known that the ionicity of the inorganic compound may be varied according to the difference in electronegativity between constituent atoms and the binding structure of a material and is closely correlated with the binding energy. As a result, the ionicity of the inorganic compound may be classified into three categories, for example, semicovalency, ionicity and strong ionicity, depending on the intensity of the binding energy (O1s) that can be easily determined using X-ray photoelectron spectroscopy.

For example, the binding energies (O1s) measured using the X-ray photoelectron spectroscopic technique provide the characteristics of the semicovalent, ionic and very ionic oxides when they are in the range of 530.5 eV to 533.5 eV, 529.6 eV to 530.4 eV, and 528.0 eV to 529.5 eV, respectively. According to the classification, the semicovalent oxide includes $SiO_2$, $Al_2O_3$, MgO or $Ga_2O_3$, the ionic oxide includes CaO, $TiO_2$, NiO, ZnO, $ZrO_2$, $In_2O_3$, $SnO_2$ or $CeO_2$, and the very ionic oxide includes $Na_2O$, CdO, BaO or $Sb_2O_3$.

According to the classification, the inorganic material in the second layer provided in the present invention is included in the ionic material. Therefore, since the inorganic material interacts strongly with polar water molecules as a main hazardous material, the gas barrier property of the inorganic material may be expected to increase. However, it could be observed that when the inorganic material and water molecules are used alone, they are not effective in blocking moisture even if they interact to increase the thickness of the second layer (Comparative Examples 2 and 3 of Table 1).

Meanwhile, the energy band gap of the inorganic material is a very important factor in the aspect of light transmissivity. As the ionic inorganic material corresponding to the second layer according to the present invention, CaO, $TiO_2$, NiO, ZnO, $ZrO_2$, $In_2O_3$, $SnO_2$ and $CeO_2$ have energy band gaps of 7.1 eV, 3.2 eV, 3.4 eV, 5.0 eV, 3.7 eV, 3.2 eV and 3.2 eV, respectively. All the inorganic materials have an energy band gap of 3 eV or more, and thus have an advantage in that light absorption in the visible light region is small. According to one exemplary embodiment, the ionic inorganic material may have an energy band gap of 3 eV or more. For example, the ionic inorganic material may have an energy band gap of 3 eV to 10 eV, and particularly, 3 eV to 7.5 eV. The term "energy band gap" used herein means the difference in energy values when a material of interest is in the highest occupied molecular orbital (HOMO) state and the lowest unoccupied molecular orbital (LUMO) state.

The total thickness of the barrier film may be in the range of 10 nm to 1000 nm, preferably in the range of 15 nm to 500 nm, and more preferably in the range of 20 nm to 300 nm, but the present invention is not limited thereto.

When the thickness of the barrier film is less than 10 nm, it is difficult to achieve continuity of the barrier film which makes it difficult to obtain a desired level of gas barrier performance, whereas, when the thickness of the barrier film exceeds 1,000 nm, cracks may be easily formed due to an increase in internal stress or a decrease in flexibility of the barrier film which makes it difficult to improve the gas barrier property according to thickness.

The barrier film may be formed using a method such as chemical vapor deposition (CVD), sputtering, evaporation, atomic layer deposition or ion plating, but the present invention is not limited thereto.

The second layer has a thickness greater than 0 and 100 nm or less, particularly 0.1 nm or more and 70 nm or less, and more particularly 0.5 nm or more and 50 nm or less, but the present invention is not limited thereto. When the thickness of the second layer is 0.1 nm or more, a uniform second layer may be easier to form by easily forming a continuous layer, and thus a stacking effect of the second layer may be further improved. In addition, when the thickness of the second layer exceeds 100 nm, the innate characteristics of the second layer are enhanced or may cause stress. As a result, the gas barrier performance may be degraded since the barrier film including the second layer may be damaged easily.

Also, the second layer can be disposed above or below the first layer or disposed between the first layers and depending on how the barrier film is formed, the deposition of the first layer may be expected to be periodically initialized by the repeated stacking of the second layers. That is, the preventive effects of the growth of defects and the interconnection of interlayer defects in a Barix™ film structure that are caused by the alternately forming organic layers and inorganic layers may be obtained through a stacking structure of the barrier film.

In addition, the interlayer peels which are easily formed at the interface between the organic layer and the inorganic layer in the typical Barix™ film structure may be reduced by continuously stacking the inorganic layers, which makes it possible to provide a barrier film having an excellent gas barrier property.

Additionally, when volatile matters derived from the organic material are formed during the process of stacking the inorganic material on the organic material, the volatile matters may cause a reduction in the degree of compactness of the stacked inorganic material layers. According to the present invention, since the inorganic material is stacked on the inorganic material layer, a barrier film having an improved gas barrier property may be provided due to an improved degree of compactness of the added inorganic material layer.

The barrier film according to the present invention may further include a base layer. The barrier film may have a structure in which a composite layer including the first layer and the second layer is formed on one or both surfaces of the base layer. The base layer may be formed of a plastic film material, but the present invention is not limited thereto. Therefore, the present invention provides a plastic barrier film including the base layer and having an excellent gas barrier property. When the barrier film is formed using a plastic film having excellent flexibility as the base layer, the gas barrier property and the flexibility of a film may be achieved at the same time.

A plastic film showing characteristics such as flexibility and having a transparency of 60% or more, preferably 90% or more, may be used as the base layer. For example, the plastic film that may be formed as the base layer may be formed of at least one material selected from polyethylene terephthalate (PET), polyethersulfone (PES), polycarbonate (PC), polyethylene naphthalate (PEN), polyimide (PI), polyarylate and epoxy resin.

Also, at least one selected from pure filler, fiber-type filler and a mixture thereof may be further added to enhance the mechanical property and thermal property of the plastic film.

For example, at least one selected from metal, glass powder, diamond powder, silicon oxide, clay, calcium phosphate, magnesium phosphate, barium sulfate, aluminum fluoride, calcium silicate, magnesium silicate, barium silicate, barium carbonate, barium hydroxide and aluminum silicate may be used as the pure filler. Also, a glass fiber or a woven glass fiber may be used as the fiber-type filler.

The barrier film may further include a planarization layer which is formed on one or both surfaces of a stacking structure including the first layer and the second layer, or provided between layers of the stacking structure. The planarization layer between the base layer and the stacking structure may function as a buffer layer, and the planarization layer formed outside the barrier film may function as a protective layer. That is, the planarization layer may be provided to level the surface of the base layer, or enhance the interlayer adhesive strength of layers including the base layer, or release stress applied to the barrier film during the mechanical deformation, or prevent damages of films during handling of the barrier film. Also, the planarization layer may be provided between the layers of the barrier film. The planarization layer provided in the interlayer of the barrier film may function to prevent the growth of defects and the interconnection of interlayer defects, which are caused in any one of the inorganic material layers, and to enhance moisture barrier effects.

The planarization layer is an organic-inorganic mixed layer that may be formed of at least one selected from an acrylic coating composition, an epoxy-based coating composition, a metal alkoxide composition and a urethane-based coating composition. Further, the planarization layer may be formed using a sol-gel type coating composition. For example, the sol-gel type coating composition includes an organic silane and a metal alkoxide, as disclosed in Korean Patent Nos. 2006-0041696, 2008-0012553 and 2008-0012555. As necessary, the sol-gel type coating composition may further include a suitable additive, a solvent or a reactive catalyst.

The coating composition may be formed into a planarization layer using a thermosetting or photocuring technique alone or in combination.

In order to improve the adhesive strength between the planarization layer and the base layer, the surface of a base may be treated with ultraviolet rays, corona, flames, plasma, sputtering, ion beams, chemicals, etc., or an undercoat layer may be formed on the base.

The cured planarization layer may have a thickness of 0.1 μm to 20 μm, preferably 0.2 μm to 10 μm, and more preferably 0.3 μm to 5 μm, but the present invention is not limited thereto.

The barrier film according to the present invention can be widely used as a material for electronic devices. For example, the electronic device may include an electronic element wrapped in the barrier film according to the present invention. The barrier film may be included in the form of a substrate material, a protective cover or a packaging material in the electronic device. The barrier film may include a separate base layer. In some cases, the barrier film that does not include a base layer is applied to an electronic element so that the barrier film can be used as a protective layer of the electronic element.

In addition, the electronic device may be an organic or inorganic luminous body, display device, film-type cell, sensor or photovoltaic element, but the present invention is not limited thereto.

Hereinafter, the barrier film according to the present invention will be described in further detail with reference to FIGS. 1 to 4.

Figure 1:
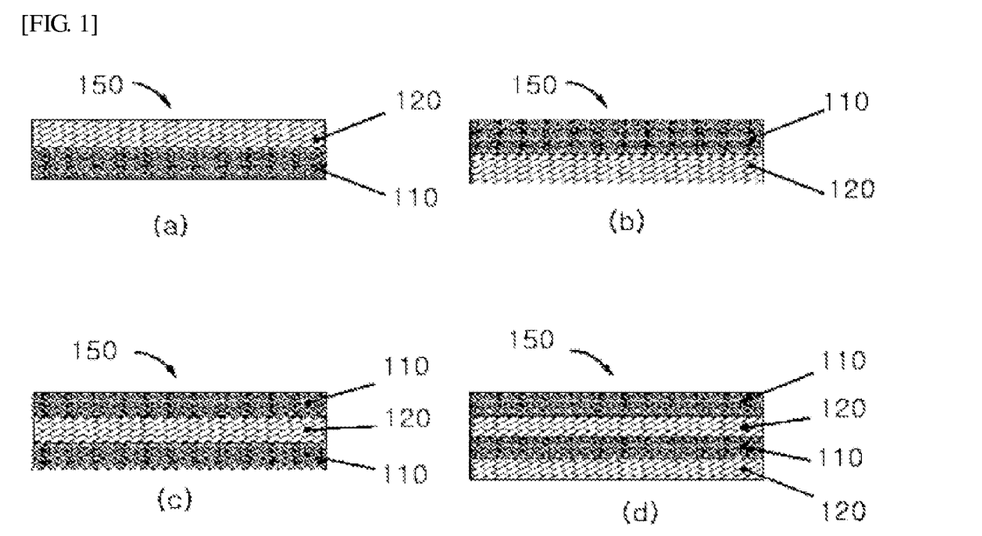
FIG. 1 is a lateral diagram of a barrier film 150 including a first layer 110 and a second layer 120 according to one exemplary embodiment of the present invention, showing (a) a structure in which the second layer is stacked on the first layer, (b) a structure in which the second layer is stacked under the first layer, (c) a structure in which the second layer is disposed between the first layers, and (d) a structure in which the first layers and the second layers are repeatedly stacked.

As shown in FIG. 1, FIG. 1 is a lateral diagram of a barrier film 150 including a first layer 110 and a second layer 120 according to one exemplary embodiment of the present invention, showing (a) a structure in which the second layer is stacked on the first layer, (b) a structure in which the second layer is stacked under the first layer, and, as a modified structure of the structures of (a) and (b), (c) a structure in which the second layer is disposed between the first layers and (d) a structure in which the first layers and the second layers are repeatedly stacked, but the present invention is not limited thereto.

Figure 2:
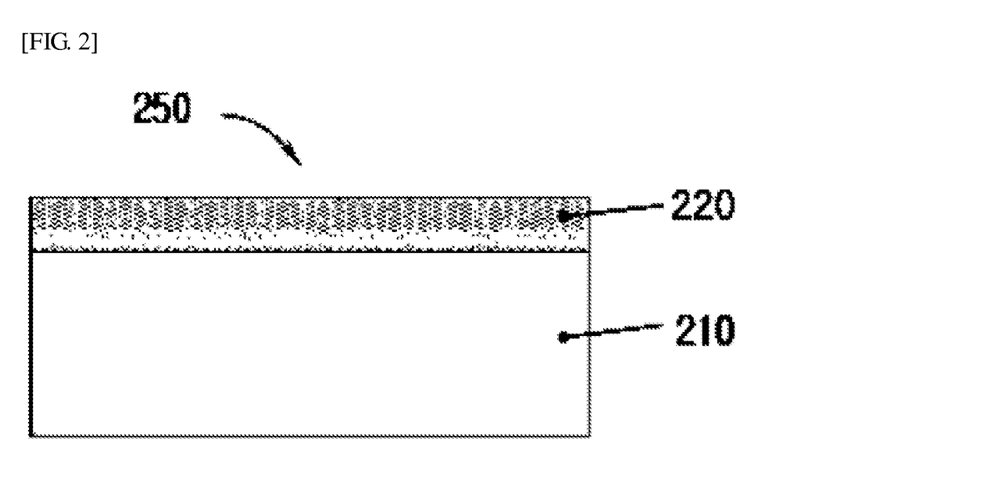
FIG. 2 is a lateral diagram of a barrier film 250 in which a composite layer 220 including the first layer and the second layer is formed on the base layer 210 according to one exemplary embodiment of the present invention.

As shown in FIG. 2, a barrier film 250 according to another exemplary embodiment of the present invention may have a structure in which a composite layer 220 including the first layer and the second layer is formed on a base layer 210.

Figure 3:
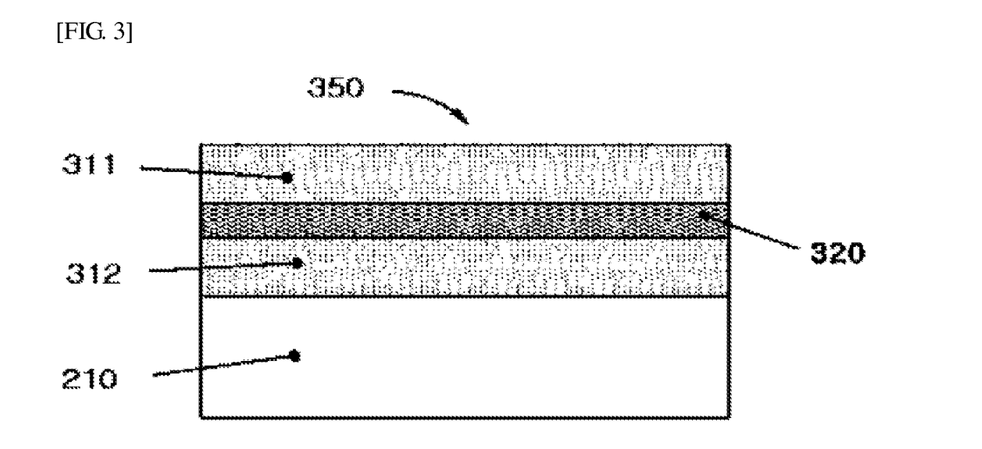
FIG. 3 is a lateral diagram of a barrier film 350 in which a composite layer 320 including the first layer and the second layer is formed on the base layer 210 according to one exemplary embodiment of the present invention, and planarization layers 311 and 312 are additionally formed on the top and bottom surfaces of the composite layer 320, respectively.

As shown in FIG. 3, a barrier film 350 according to still another exemplary embodiment of the present invention may have a structure in which a composite layer 320 including the first layer and the second layer is formed on the base layer 210, and planarization layers 311 and 312 are additionally formed on the top and bottom surfaces of the composite layer 150, respectively.

Figure 4:
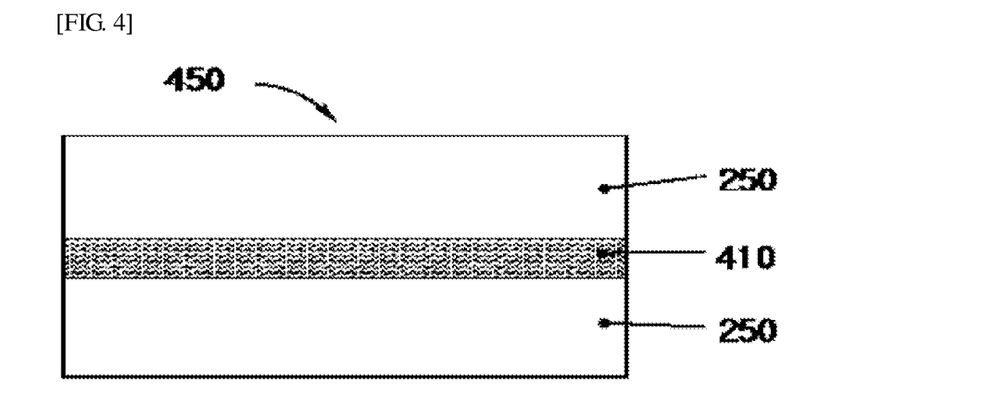
FIG. 4 is a lateral diagram of a barrier film 450 manufactured by laminating two barrier films 250 using an adhesive layer 410, in which a surface of a base is laminated with a surface of another base or a surface of a barrier film is laminated with a surface of another barrier film.

As shown in FIG. 4, a barrier film 450 according to the present invention may include two barrier films 250 and an adhesive layer 410 provided between the two barrier films 250, and may have a structure in which the two barrier films 250 are laminated by means of the adhesive layer 410.

Figure 5:
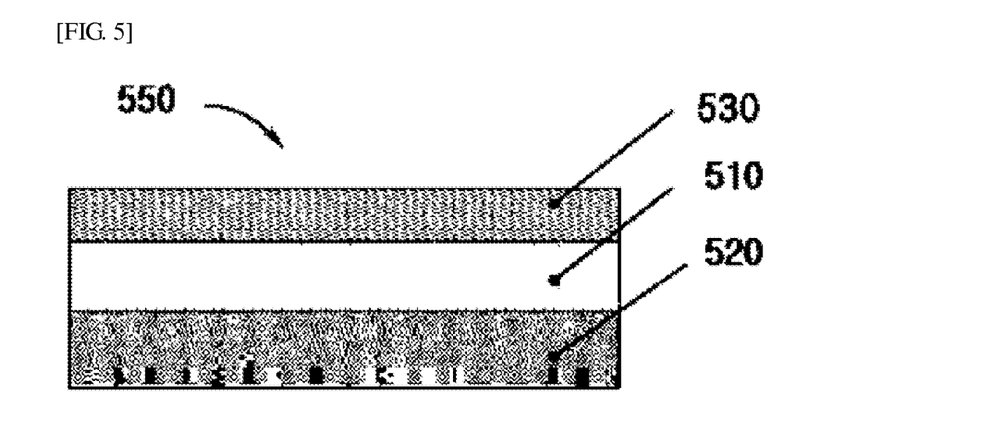
FIG. 5 shows a structure 550 in which a barrier film 530 is stacked on an electronic element 510 formed on a substrate material 520 according to one exemplary embodiment of the present invention.

As shown in FIG. 5, a barrier film 530 according to the present invention may be used to electrically or chemically protect the electric element 510 formed on the substrate material 520. Here, the substrate material may be a glass plate, a semiconductor wafer or the barrier film, and the electric element may be a display element, a photovoltaic element, an in-plane luminous body, etc.

The present invention will be described in further detail with reference to the following examples. However, it should be understood that the description proposed herein is merely a preferable example for the purpose of illustration only, and not intended to limit the scope of the invention.

EXAMPLES

Example 1

A PET film having a thickness of 50 μm (A4300 commercially available from Toyobo) was used as a plastic base layer. The top surface of the plastic base layer was coated with a silane-based sol-type solution including tetraethoxy silane at 32.5 parts by weight and glycidoxypropyltrimethoxy silane at 64.0 parts by weight as main components, and the coated silane-based sol-type solution was thermoset at 120° C. for 10 minutes to form a planarization layer (a buffer layer) having a thickness of 0.5 μm. The first layer formed of SiON was deposited to a thickness of 48 nm on the top surface of the planarization layer using a sputtering technique while supplying a mixed gas of argon and oxygen to a deposition device. Thereafter, the second layer formed of ZnO was deposited to a thickness of 8 nm on the SiON first layer, and another first layer formed of SiON was re-deposited to a thickness of 24 nm on the second layer formed of ZnO to form a barrier film. Then, the barrier film was coated with the silane-based sol-type solution in the same manner as in the top surface of the base layer, and the silane-based sol-type solution was thermoset to form an outer planarization layer (a protective layer), thereby manufacturing a barrier film.

The moisture permeability of the manufactured barrier film was evaluated under the conditions of 100% relative humidity and a temperature of 38° C. using L80-5000LP (Lyssy), and the optical properties were measured using Cary 3E (Varian). The results are listed in the following Table 1.

Comparative Example 1

A barrier film was manufactured in the same manner as in Example 1, except that an inorganic material layer formed of only SiON and deposited to a thickness of 80 nm was used as the inorganic material layer in Comparative Example 1. The moisture permeability and optical properties measured for the manufactured barrier film are listed in the following Table 1.

Comparative Example 2

A barrier film was manufactured in the same manner as in Example 1, except that an inorganic material layer formed of only ZnO and deposited to a thickness of 62 nm was used as the inorganic material layer in Comparative Example 2. The moisture permeability and optical properties measured for the manufactured barrier film are listed in the following Table 1.

Comparative Example 3

A barrier film was manufactured in the same manner as in Example 1, except that an inorganic material layer formed of only ZnO and deposited to a thickness of 89 nm was used as the inorganic material layer in Comparative Example 3. The moisture permeability and optical properties measured for the manufactured barrier film are listed in the following Table 1.

TABLE 1

| | | Structure of inorganic material layers | Thickness (nm) | Optical properties | | Moisture permeability ($g/m^2 \cdot day$) |
|---|---|---|---|---|---|---|
| | | | | T (%) | b* | |
| Example | 1 | SiON/ZnO/SiON | 48/8/24 | 91.5 | 0.8 | 0.004 |
| Comparative | 1 | SiON | 80 | 91.3 | 0.1 | 0.008 |
| Examples | 2 | ZnO | 62 | 84.2 | −1.9 | >0.2 |
| | 3 | ZnO | 89 | 87.4 | 2.1 | >0.2 |

*ZnO is deposited using a target including Ga at 6% by weight, and SiON is deposited using a $Si_3N_4$ target.

Figure 6:
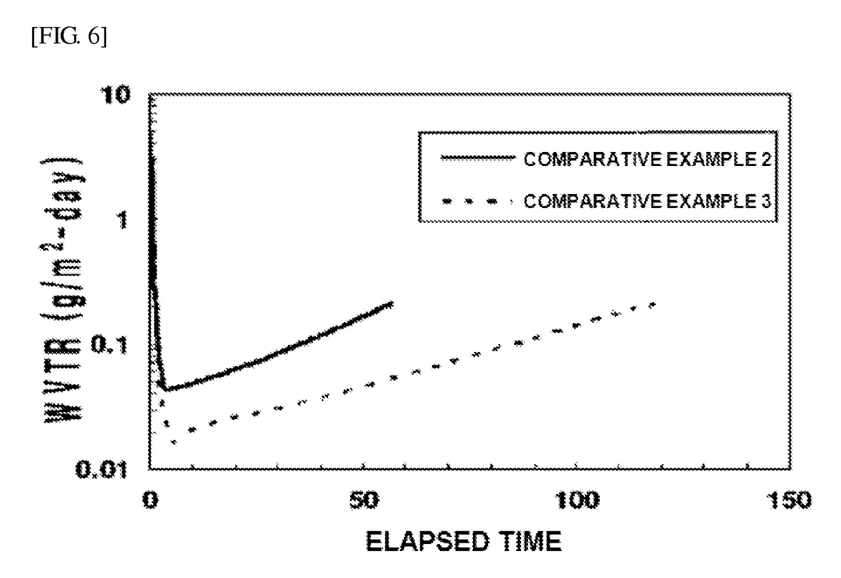
FIG. 6 shows the behavior of moisture permeability according to a variation in time when using only ZnO in Comparative Examples 2 and 3.

As listed in Table 1, it could be observed that the barrier film formed by inorganic material in Example 1 had excellent moisture permeability and light transmissivity compared to those of Comparative Examples 1 to 3. The barrier films of Comparative Examples 2 and 3 had moisture permeabilities of approximately 0.045 $g/m^2 \cdot day$ and 0.014 $g/m^2 \cdot day$ at the beginning of the measurements, but the moisture permeabilities increased to 0.2 $g/m^2 \cdot day$ or more with time (See FIG. 6).

Example 2

A PET film having a thickness of 50 μm (A4300 commercially available from Toyobo) was used as the plastic base layer. The top surface of the plastic base layer was coated with a silane-based sol-type solution including tetraethoxy silane at 40.0 parts by weight and glycidoxypropyltrimethoxy silane at 56.5 parts by weight as main components, and the coated silane-based sol-type solution was thermoset at 120° C. for 10 minutes to form a planarization layer (a buffer layer) having a thickness of 0.5 μm. The first layer formed of SiON was deposited to a thickness of 48 nm on the top surface of the planarization layer using a sputtering technique while supplying a mixed gas of argon and oxygen to a deposition device. Thereafter, the second layer formed of ZnO was deposited to a thickness of 9 nm on the first layer formed of SiON, and another first layer formed of SiON was re-deposited to a thickness of 24 nm on the second layer formed of ZnO to form a barrier film, thereby manufacturing a barrier film.

The moisture permeability of the manufactured barrier film was evaluated under the conditions of 100% relative humidity and a temperature of 38° C. using L80-5000LP (Lyssy). The evaluation results are listed in the following Table 2.

Example 3

A barrier film was manufactured in the same manner as in Example 2, except that the thickness of the inorganic material layers in the barrier film were varied as listed in the following Table 2 in Example 3. The measurement results of the moisture permeability of the manufactured barrier film are listed in the following Table 2.

Example 4

A barrier film was manufactured in the same manner as in Example 2, except that the thickness of the inorganic material layers in the barrier film were varied as listed in the following Table 2 in Example 4. The measurement results of the moisture permeability of the manufactured barrier film are listed in the following Table 2.

Comparative Example 4

A barrier film was manufactured in the same manner as in Example 2, except that an inorganic material layer formed of only SiON as the inorganic material layer and deposited to a thickness of 80 nm was used instead of the barrier film in Comparative Example 4. The measurement results of the moisture permeability of the manufactured barrier film are listed in the following Table 2.

Example 5

A PET film having a thickness of 50 μm (A4300 commercially available from Toyobo) was used as the plastic base layer. The top surface of the plastic base layer was coated with a silane-based sol-type solution including tetraethoxy silane at 40.0 parts by weight and glycidoxypropyltrimethoxy silane at 56.5 parts by weight as main components, and the coated silane-based sol-type solution was thermoset at 120° C. for 10 minutes to form a planarization layer (a buffer layer) having a thickness of 0.5 μm. The first layer formed of SiON was deposited to a thickness of 40 nm on the top surface of the planarization layer using a sputtering technique while supplying a mixed gas of argon and oxygen to a deposition device. Thereafter, the second layer was deposited to a thickness of 10 nm on the first layer formed of SiON using a $SnO_2$—ZnO target (molar ratio 1:1) and argon gas, and another first layer formed of SiON was re-deposited to a thickness of 24 nm on the second layer formed of the $SnO_2$—ZnO target to manufacture a barrier film.

The moisture permeability of the manufactured barrier film was evaluated under the conditions of 100% relative humidity and a temperature of 38° C. using L80-5000LP (Lyssy). The evaluation results are listed in the following Table 2.

Example 6

A barrier film was manufactured in the same manner as in Example 5, except that the thickness of the inorganic material layers in the barrier film were varied as listed in the following Table 2 in Example 6. The measurement results of the moisture permeability of the manufactured barrier film are listed in the following Table 2.

Example 7

A PET film having a thickness of 50 μm (A4300 commercially available from Toyobo) was used as the plastic base layer. The top surface of the plastic base layer was coated with a silane-based sol-type solution including tetraethoxy silane at 40.0 parts by weight and glycidoxypropyltrimethoxy silane at 56.5 parts by weight as main components, and the coated silane-based sol-type solution was thermoset at 120° C. for 10 minutes to form a planarization layer having a thickness of 0.5 μm (a buffer layer). The first layer formed of SiON was deposited to a thickness of 32 nm on the top surface of the planarization layer using a sputtering technique while supplying a mixed gas of argon and oxygen to a deposition device. Thereafter, the second layer formed of indium tin oxide (ITO) was deposited to a thickness of 10 nm on the first layer formed of SiON using a mixed gas of argon and oxygen, and another first layer formed of SiON was re-deposited to a thickness of 24 nm on the second layer formed of ITO to manufacture a barrier film.

The moisture permeability of the manufactured barrier film was evaluated under the conditions of 100% relative humidity and a temperature of 38° C. using L80-5000LP (Lyssy). The evaluation results are listed in the following Table 2.

Comparative Example 5

A barrier film was manufactured in the same manner as in Example 5, except that an inorganic material layer formed of only $SnO_2$ and ZnO as the inorganic material layer and deposited to a thickness of 80 nm was used instead of the barrier film in Comparative Example 5. The measurement results of the moisture permeability of the manufactured barrier film are listed in the following Table 2.

TABLE 2

| Structure of inorganic material layers | Thickness (nm) | Moisture permeability $(g/m^2 \cdot day)$ |
|---|---|---|
| Example 2 | SiON/ZnO/SiON | 48/9.0/24 | 0.006 |
| Example 3 | SiON/ZnO/SiON | 48/4.5/24 | 0.008 |
| Example 4 | SiON/ZnO/SiON/ZnO/SiON | 32/9/16/9/24 | 0.004 |
| Comparative Example 4 | SiON | 80 | 0.014 |
| Example 5 | SiON/$SnO_2$—ZnO/SiON | 40/10/24 | 0.012 |
| Example 6 | SiON/$SnO_2$—ZnO/SiON | 32/20/24 | 0.010 |
| Example 7 | SiON/ITO/SiON | 32/10/24 | 0.004 |
| Comparative Example 5 | $SnO_2$—ZnO | 80 | 0.021 |

As listed in Table 2, it could be confirmed that the barrier films of Examples 2 and 3 according to the present invention showed lower moisture permeability than that of Comparative Example 4, indicating that the use of the second layer enabled the barrier films to have an improved gas barrier property. Also, it could be confirmed that when the barrier film of Example 2 was compared with that of Example 3, the use of ZnO as the second layer enabled the barrier films to continuously decrease in moisture permeability with an increase in thickness. In addition, it could be confirmed that when the barrier film of Example 2 was compared with that of Example 4, the additional use of ZnO and SiON enabled the barrier films to further decrease in moisture permeability.

As listed in Table 2, it could be observed that the barrier films of Examples 5 and 6 using $SnO_2$—ZnO as a second inorganic material also showed lower moisture permeability than those of Comparative Examples 4 and 5, indicating the effects of the second layer according to the present invention. Also, as listed in Table 2, it could be observed that the barrier film of Example 7 using ITO as the second inorganic material also showed lower moisture permeability than that of Comparative Example 4, indicating that the use of the barrier film according to the present invention improved the gas barrier property.

As seen from the apparent effects of the planarization layer in Comparative Examples 1 to 4, it could be seen that the additional formation of an outer planarization layer makes it possible to achieve lower moisture permeability, as described in Examples 2 to 7.

The barrier film according to the present invention has excellent properties such as gas barrier property, moisture barrier property and light transmissivity, and thus can be widely used as a material for electronic devices.

INDUSTRIAL APPLICABILITY

The barrier film according to the present invention has excellent properties such as light transmissivity, gas barrier property and moisture barrier property, compared to the typical gas-barrier plastic composite films manufactured using only a metal oxide or nitride, and thus can be widely used in the field of applications including a material for parts of electronic devices.

While the invention has been shown and described with reference to certain exemplary embodiments thereof, it will be understood by those skilled in the art that various changes in form and details may be made therein without departing from the scope of the invention as defined by the appended claims.

DESCRIPTION OF CODES 150, 250, 350, 450, 530, 550: barrier film
110: first layer 120: second layer
220, 320: composite layer
210: base layer
311, 312: planarization layer
410: adhesive layer
510: electronic element
520: substrate material

What is claimed is:

1. A barrier film comprising:
a stacked sheet having a top surface and a bottom surface and comprising:
at least two first layers formed of a semicovalent inorganic material; and
at least one second layer formed of an ionic inorganic material,
wherein:
each second layer is disposed between two first layers with one first layer in contact with a first surface of the second layer and the other first layer in contact with an opposite second surface of the second layer,
each first layer and second layer are alternately disposed,
the first layers are disposed to form both the top and bottom surfaces of the stacked sheet,
the semicovalent inorganic material comprises a metal oxide, a nitride of the corresponding metal or a mixture thereof, all of which have a binding energy of 530.5 eV to 533.5 eV,
the ionic inorganic material comprises a metal oxide, a nitride of the corresponding metal or a mixture thereof, all of which have a binding energy of 529.6 eV to 530.4 eV,
the difference in binding energy between the semicovalent inorganic material and the ionic inorganic material is in the range of 0.1 eV to 3.9 eV, and
the ionic inorganic material is an oxide, a nitride or a nitride oxide including at least one metal selected from the group consisting of calcium, zinc, zirconium, indium and cerium.

2. The barrier film of claim 1, wherein the semicovalent inorganic material is an oxide, a nitride or a nitric oxide including at least one metal selected from the group consisting of silicon, aluminum, magnesium and gallium.

3. The barrier film of claim 1, wherein the stacked sheet has a thickness of 10 nm to 1,000 nm.

4. The barrier film of claim 1, wherein the second layer has a thickness of greater than 0 and 100 nm or less.

5. The barrier film of claim 1, wherein the ionic inorganic material has an energy band gap of 3.0 eV or more.

6. The barrier film of claim 1, further comprising a base layer.

7. The barrier film of claim 6, wherein the base layer is formed of a resin selected from a group consisting of polyethylene terephthalate, polyethersulfone, polycarbonate, polyethylene naphthalate, polyimide, polyarylate and epoxy.

8. An electronic device comprising an electronic element packed by the barrier film defined in claim 1.

9. The electronic device of claim 8, wherein the barrier film is formed of a substrate material, a protective cover or a packaging material.

10. The electronic device of claim 8, wherein the electronic device is an organic or inorganic luminous body, a display device, a film-type cell, a sensor or a photovoltaic element.

11. The barrier film of claim 1, further comprising a planarization layer provided on one or both surfaces of the stacked sheet, or provided between the layers of the stacked sheet, wherein the planarization layer includes at least one composition selected from the group consisting of an acrylic coating composition, a metal alkoxide composition and a sol-gel type composition comprising an organic silane.

* * * * *